US009435896B2

(12) United States Patent
Afzali-Ardakani et al.

(10) Patent No.: US 9,435,896 B2
(45) Date of Patent: Sep. 6, 2016

(54) RADIATION DETECTOR BASED ON CHARGED SELF-ASSEMBLED MONOLAYERS ON NANOWIRE DEVICES

(71) Applicant: GLOBALFOUNDRIES INC., Grand Cayman (KY)

(72) Inventors: Ali Afzali-Ardakani, Ossining, NY (US); Jose M. Lobez Comeras, New York, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 315 days.

(21) Appl. No.: 13/955,740

(22) Filed: Jul. 31, 2013

(65) Prior Publication Data

US 2015/0034834 A1 Feb. 5, 2015

(51) Int. Cl.
*G01T 1/16* (2006.01)
*H01L 31/0352* (2006.01)
*H01L 31/08* (2006.01)

(52) U.S. Cl.
CPC ..... *G01T 1/1606* (2013.01); *H01L 31/035227* (2013.01); *H01L 31/085* (2013.01); *Y10S 977/954* (2013.01)

(58) Field of Classification Search
CPC .......... H01L 29/0669; H01L 31/035227; H01L 31/085; B82Y 15/00; G01N 27/4146; Y10S 977/762; Y10S 977/954; G01T 1/1606
USPC ........... 250/336.1, 370.14, 370.01; 977/762, 977/954; 257/414, E33.005, E29.07
See application file for complete search history.

(56) References Cited

U.S. PATENT DOCUMENTS

| | | | |
|---|---|---|---|
| 4,903,108 A * | 2/1990 | Young et al. ................ 257/501 |
| 5,019,875 A * | 5/1991 | Nishiguchi et al. .......... 257/285 |
| 5,332,903 A * | 7/1994 | Buehler et al. .......... 250/370.14 |
| 6,882,051 B2 | 4/2005 | Majumdar et al. |
| 7,940,381 B2 | 5/2011 | Afzali-Ardakani et al. |
| 7,998,788 B2 | 8/2011 | Guha et al. |
| 8,110,883 B2 | 2/2012 | Ward et al. |
| 8,138,102 B2 | 3/2012 | Afzali-Ardakani et al. |
| 2002/0090569 A1* | 7/2002 | Suzuki ................. G03F 7/0045 430/270.1 |
| 2004/0213307 A1* | 10/2004 | Lieber et al. .................... 372/39 |
| 2005/0095698 A1* | 5/2005 | Carlson ...................... 435/287.2 |
| 2005/0181587 A1* | 8/2005 | Duan et al. .................... 438/551 |

(Continued)

OTHER PUBLICATIONS

J.P. Folkers et al., "Self-assembled monolayers of long-chain hydroxamic acids on the native oxides of metals," Langmuir, 11, 813-824 (Mar. 1995).

(Continued)

*Primary Examiner* — David Porta
*Assistant Examiner* — Blake Riddick
(74) *Attorney, Agent, or Firm* — David Cain; Andrew M. Calderon; Roberts Mlotkowski Safran Cole & Calderon P.C.

(57) ABSTRACT

Radiation detectors having nanowires with charged, radiation-labile coatings configured to change the electrical properties of nanowires are provided. In one aspect, a radiation detection device is provided. The radiation detector device includes at least one nanowire having a radiation-labile coating with charged moieties on a surface thereof, wherein the radiation-labile coating is configured to degrade upon exposure to radiation such that the charged moieties are cleaved from the radiation-labile coating upon exposure to radiation and thereby affect a transconductance of the nanowire.

20 Claims, 5 Drawing Sheets

(56) References Cited

U.S. PATENT DOCUMENTS

| | | | |
|---|---|---|---|
| 2005/0239634 A1* | 10/2005 | Ying et al. ................... 502/64 |
| 2006/0054936 A1* | 3/2006 | Lieber et al. ................ 257/210 |
| 2006/0065989 A1* | 3/2006 | Druffel et al. ............. 264/1.32 |
| 2007/0010702 A1* | 1/2007 | Wang et al. ..................... 600/8 |
| 2007/0116628 A1* | 5/2007 | Shew ................... B82Y 10/00 423/447.2 |
| 2007/0155025 A1* | 7/2007 | Zhang et al. ..................... 438/3 |
| 2007/0197957 A1* | 8/2007 | Hunter ................ A61L 31/10 604/65 |
| 2007/0264764 A1* | 11/2007 | Afzali-Ardakani .... B82Y 10/00 438/197 |
| 2007/0278179 A1* | 12/2007 | Afzali-Ardakani et al. ... 216/41 |
| 2008/0021339 A1* | 1/2008 | Gabriel ................ A61B 5/0833 600/532 |
| 2008/0145706 A1* | 6/2008 | Mevellec et al. ............. 428/704 |
| 2009/0098347 A1* | 4/2009 | Afzali-Ardakani ... C07C 271/20 428/195.1 |
| 2009/0146068 A1* | 6/2009 | Agarwal ................. G01T 1/026 250/370.07 |
| 2010/0179054 A1* | 7/2010 | Swager et al. ................ 502/162 |
| 2010/0239488 A1* | 9/2010 | Zettl et al. ................. 423/447.1 |
| 2010/0260745 A1* | 10/2010 | Zhou et al. ................ 424/130.1 |
| 2010/0325073 A1* | 12/2010 | Haick ............................. 706/12 |
| 2010/0330687 A1* | 12/2010 | Afzali-Ardakani et al. . 436/149 |
| 2011/0003279 A1* | 1/2011 | Patel ................................ 435/5 |
| 2011/0081724 A1* | 4/2011 | Swager et al. ................. 436/57 |
| 2011/0169678 A1* | 7/2011 | Wang et al. .................. 341/144 |
| 2011/0215227 A1* | 9/2011 | Yan et al. ................. 250/214 A |
| 2012/0156833 A1* | 6/2012 | Kawashima et al. ......... 438/151 |
| 2012/0172648 A1* | 7/2012 | Seebauer ...................... 585/733 |
| 2012/0295360 A1 | 11/2012 | Swager et al. |
| 2012/0326044 A1* | 12/2012 | Ghelmansarai .......... 250/370.07 |
| 2013/0082233 A1 | 4/2013 | Afzali-Ardakani et al. |
| 2014/0113828 A1* | 4/2014 | Gilbert et al. ................ 505/100 |
| 2014/0184196 A1* | 7/2014 | Lieber ................ G01N 27/4146 324/92 |

OTHER PUBLICATIONS

H. Park et al., "High-density integration of carbon nanotubes via chemical self-assembly," Nature Nanotech., 7, 787-791, Dec. 2012 (published Oct. 2012).

Draper et al., "Radiation Response of a Gate-All-Around Silicon Nano-Wire Transistor," IEEE Transactions on Nuclear Science, vol. 56. No. 6, Dec. 2009, pp. 3274-3279.

Kaushal et al., "Radiation Effects in Si-NW GAA FET and CMOS Inverter: A TCAD Simulation Study," IEEE Transactions on Electron Devices, vol. 59, No. 5, May 2012, pp. 1563-1566.

Ayscough et al., "Electron spin resonance spectra of γ-irradiated sulphones and polysulphones," Transactions of the Faraday Society, vol. 61, Jun. 1965, pp. 1110-1117.

Brown et al., "γ Radiolysis of Poly (butene-1 sulfone) and Poly (hexane-1 sulfone)," Macromolecules, vol. 5, No. 2, Mar.-Apr. 1972, pp. 109-114.

Lobez et al., "Radiation detection: Resistivity responses in functional poly (olefin sulfone)/carbon nanotube composites," Angewandte Chemie, vol. 122, No. 1, Nov. 2009, pp. 99-102.

* cited by examiner

RADIATION DETECTOR BASED ON CHARGED SELF-ASSEMBLED MONOLAYERS ON NANOWIRE DEVICES

FIELD OF THE INVENTION

The present invention relates to radiation detection and more particularly, to radiation detectors having nanowires with charged, radiation-labile coatings configured to change the electrical properties of nanowires.

BACKGROUND OF THE INVENTION

Radiation detectors are necessary for the detection of dangerous ionizing radiation in environments where radioactive materials are stored or actively used, such as hospitals, nuclear plants, and research labs. The dose of exposure to ionizing radiation needs to be recorded to monitor exposure over time of workers or patients that can be intentionally or unintentionally exposed to high doses of ionizing radiation.

The current technologies for detection and dosimetry of ionizing radiation from a point of view of personal monitoring have one or several of the following drawbacks: lack of capability of on-site signal generation; need for trained personnel to interpret the signal; need for expensive and bulky cooling systems; and expensive hardware or upkeep.

Thus, improved radiation detectors that are cost effective to implement and easy to use and maintain would be desirable.

SUMMARY OF THE INVENTION

The present invention provides radiation detectors having nanowires with charged, radiation-labile coatings configured to change the electrical properties of nanowires. In one aspect of the invention, a radiation detection device is provided. The radiation detector device includes at least one nanowire having a radiation-labile coating with charged moieties on a surface thereof, wherein the radiation-labile coating is configured to degrade upon exposure to radiation such that the charged moieties are cleaved from the radiation-labile coating upon exposure to radiation and thereby affect a transconductance of the nanowire.

In another aspect of the invention, another radiation detection device is provided. The radiation detection device includes at least one transistor having: a back gate formed in a wafer; at least one nanowire on the wafer over the back gate, the nanowire having a radiation-labile coating with charged moieties on a surface thereof, wherein the radiation-labile coating is configured to degrade upon exposure to radiation such that the charged moieties are cleaved from the radiation-labile coating upon exposure to radiation and thereby affect a transconductance of the nanowire; and source and drain electrodes in contact with opposite ends of the nanowire.

In yet another aspect of the invention, a method of forming a radiation detection device is provided. The method includes the following steps. A back gate is formed in a wafer. At least one nanowire is deposited on the wafer over the back gate. Source and drain electrodes are formed in contact with opposite ends of the nanowire. A surface of the nanowire is covered with a radiation-labile coating having charged moieties, wherein the radiation-labile coating is configured to degrade upon exposure to radiation such that the charged moieties are cleaved from the radiation-labile coating upon exposure to radiation and thereby affect a transconductance of the nanowire.

In still yet another aspect of the invention, a method for radiation detection is provided. The method includes the following steps. A transconductance output signal is obtained from a radiation detection device at time t, wherein the radiation detection device includes at least one nanowire having a radiation-labile coating with charged moieties on a surface thereof, wherein the radiation-labile coating is configured to degrade upon exposure to radiation such that the charged moieties are cleaved from the radiation-labile coating upon exposure to radiation and thereby affect a transconductance of the nanowire. The transconductance output signal obtained from the radiation detection device at time t is compared to an initial transconductance output signal of the radiation detection device. It is determined whether the transconductance output signal obtained from the radiation detection device at time t is the same as the initial transconductance output signal of the radiation detection device. It is determined that the radiation detection device has not been exposed to radiation if the transconductance output signal obtained from the radiation detection device at time t is the same as the initial transconductance output signal of the radiation detection device, otherwise it is determined that the device has been exposed to radiation.

A more complete understanding of the present invention, as well as further features and advantages of the present invention, will be obtained by reference to the following detailed description and drawings.

DETAILED DESCRIPTION OF PREFERRED EMBODIMENTS

Provided herein are devices that detect radiation based on changes in the electrical properties of nanowires. For instance, according to an exemplary embodiment, in an initial state, the nanowires of the device are covered with an active, radiation labile coating, which is charged. See FIG. 1. In the example shown in FIG. 1, the nanowires are silicon (Si) nanowires coated with a metal oxide, such as hafnium dioxide ($HfO_2$) or aluminum oxide ($Al_2O_3$). As will be described in detail below, this metal oxide coating on the nanowires can be used to template coverage of the nanowires with a monolayer of the active coating. As also described below, the present techniques can leverage the fact that certain compounds, such as hydroxamic acid, selectively interact with certain metal oxides or other materials (silicon nitride, aluminum oxide) over silicon dioxide. Thus, this concept can be used to selectively template the coating on the nanowires.

Figure 1:
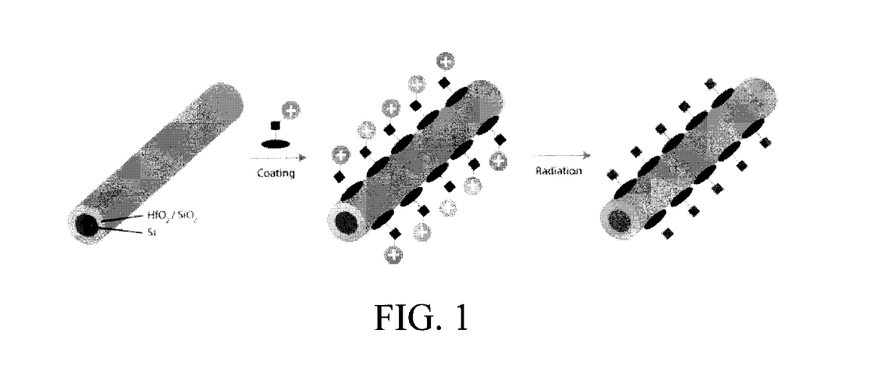
FIG. 1 is a schematic diagram illustrating how changes in the electrical properties of nanowires coated with a radiation labile coating are implemented for radiation detection according to an embodiment of the present invention.

As shown in FIG. 1, the active coating contains molecules with charged groups. In this example, the groups have a positive charge as indicated by the (+) symbol. Exemplary molecules for use in forming the active coating are described below. The presence of the (charged) active coating affects transconductance of the nanowires. As is known in the art, transconductance is a ratio of current change at output to voltage change at input. Upon radiation exposure, the nanowire coating is degraded so that the charged moieties of the coating are cleaved and removed, leaving a nanowire behind which will now have a different transconductance, which can be measured with a 2-point or 3-point device configuration. Exemplary device configurations are described below.

The present techniques offer the following advantages: 1) the signal generated is electrical, and can be read in-situ without the need for any further manipulation of the detector; 2) the change experienced by the detector is irreversible, which means this system can be used for dosimetry applications (where radiation dose is measured based, e.g., on duration of exposure, energy of radiation, etc.); 3) this technology is based on low-energy consuming nanowire electronics; 4) no cooling mechanism is needed, and the detector can operate at room temperature; 5) the radiation detector is small, light and can be easily worn; and 6) the device can be formed on a substrate (see below) that is easy to dispose and/or recycle, such as a plastic substrate.

In one exemplary embodiment, the present radiation detector device is configured as a nanowire-based transistor, in which the nanowires are the semiconducting element of the transistor. See FIG. 2A. In general, a transistor includes a source and a drain interconnected by a channel (in this case the nanowire). A gate regulates electron flow through the channel. In the configuration shown in FIG. 2A, the device is back-gated. This permits unobstructed exposure of the (charged) nanowire(s) of the device to the environment for radiation detection. Each transistor can include one or more nanowires.

Figure 2A:
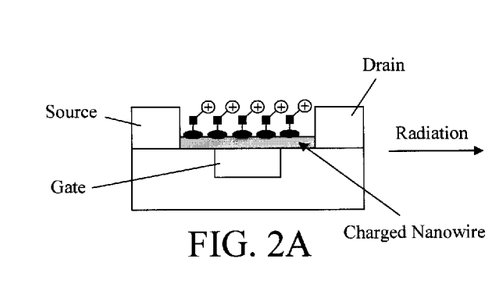
FIG. 2A is a diagram illustrating an exemplary transistor configuration of the present nanowire-based radiation detector when the device is in an initial state according to an embodiment of the present invention.
Figure 2B:
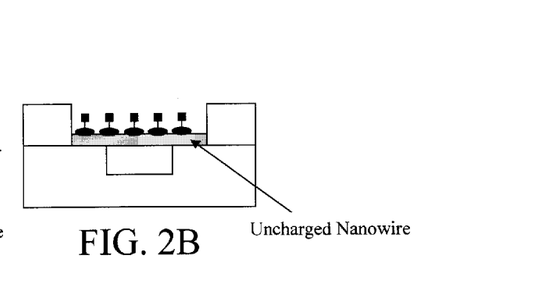
FIG. 2B is a diagram illustrating the nanowire-based radiation detector of FIG. 2A after exposure to radiation, wherein the exposure results in degradation of the nanowire coating such that the charged moieties of the coating are cleaved and removed according to an embodiment of the present invention.

As shown in FIG. 2, in an initial state (i.e., prior to the device being exposed to radiation), the nanowire(s) is/are covered with an active, radiation labile coating bearing a positive charge. Transconductance of the nanowire(s) can be measured at the source and drain. As shown in FIG. 2B, upon exposure to radiation, the nanowire coating is degraded so that the charged moieties of the coating are cleaved and removed. As a result, the nanowire(s) is/are (post-exposure) uncharged. This change in charge will change the transconductance of the nanowire(s). It is notable that while the illustrations in FIGS. 2A-B show removal of all of the surface charge on the nanowire(s) upon exposure to radiation, this is merely an exemplary depiction intended to illustrate the present techniques. The amount of the charged groups cleaved from the nanowire coating is directly proportional to an amount of radiation to which the device is exposed. Accordingly, the present devices are well suited for dosimetry applications based on the amount of charged molecules still left on the surface of the nanowire(s) after exposure which can be derived from the electrical properties of the nanowire transistor. As such, the radiation dose can be effectively ascertained.

Figures 3A, 3B, 3C:
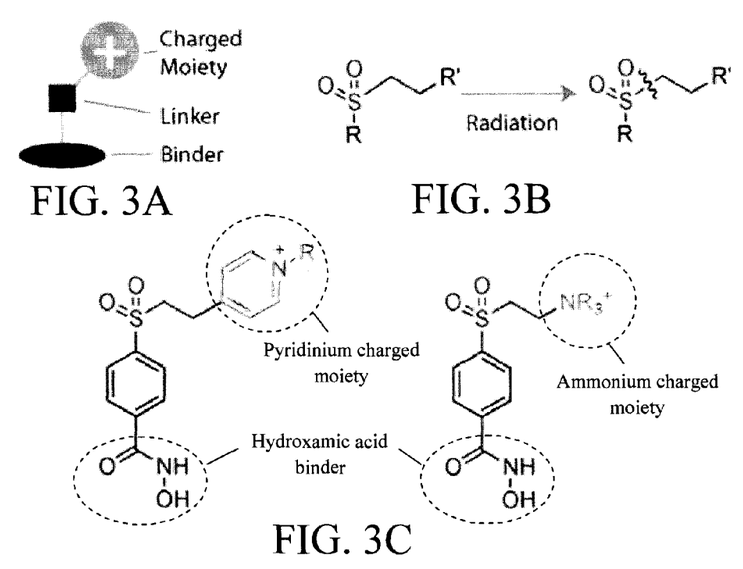
FIG. 3A is a schematic diagram of a charged molecule that may be used to form an active, radiation labile coating on the present nanowire-based radiation detectors, wherein the charged molecule includes a (radiation-labile) linker, a binder, and a charged moiety according to an embodiment of the present invention.
FIG. 3B is a diagram illustrating the radiation-labile linker, e.g., an alkyl sulfone, and carbon-sulfur bond cleavage upon radiation exposure according to an embodiment of the present invention.
FIG. 3C is a diagram illustrating possible candidate molecules for the coating according to an embodiment of the present invention.

According to an exemplary embodiment, the nanowires are coated with a monolayer of the charged compound depicted schematically in FIG. 3A. As shown in FIG. 3A, this compound has three components: a radiation-labile linker, a binder—to bind to the surface of the nanowires, and a charged moiety.

According to an exemplary embodiment, the radiation labile linker functional group of the compound is a sulfone. Alkyl-sulfones are compounds which degrade in the presence of ionizing radiation such as high energy photons (gamma rays, X-rays), beams of ions and electrons. See FIG. 3B. As shown illustrated in FIG. 3B, exposure of alkyl-sulfones to radiation leads to cleavage of the easily altered, labile carbon-sulfur bond.

FIG. 3C illustrates some exemplary molecules for use in forming the present active, radiation-labile coating for the nanowires. As shown in FIG. 3C, for the case of the present active coatings, radiation exposure means cleavage of the charged part (moiety) of the molecule, which will leave behind a coating bearing no charge.

Selective coating of metal oxide surfaces, such as aluminum oxide and hafnium oxide, can be achieved using molecules that contain hydroxamic acids as the binder. See FIG. 3C. Phosphonic acids are also suitable binders for the molecules. Accordingly, as provided herein, when the binder includes hydroxamic or phosphonic acid, to ensure complete/uniform coverage of the radiation-labile coating on the nanowires, the nanowires can be configured to have a shell made of a metal oxide select for hydroxamic/phosphonic acid interaction.

Accordingly, the present techniques can leverage the fact that certain compounds, such as hydroxamic or phosphonic acid, interact with certain metal oxides or other materials (silicon nitride, aluminum oxide, etc.). See, for example, J. P. Folkers et al., "Self-assembled monolayers of long-chain hydroxamic acids on the native oxides of metals," *Langmuir*, 11, 813-824 (March 1995) (hereinafter "Folkers"), and H. Park et al., "High-density integration of carbon nanotubes via chemical self-assembly," *Nature Nanotech.*, 7, 787-791 (December 2012). The entire contents of each of the foregoing references are incorporated by reference herein. See also, U.S. Patent Application Publication Number 2013/0082233 which describes an exemplary process for decorating a surface of a substrate with a charge. Further, the interaction of hydroxamic or phosphonic acid with materials such as $HfO_2$ is selective to other materials such as silicon dioxide. Thus, if there are areas of the device for which coverage of the coating is not desired, then these areas can be formed from a material (such as silicon dioxide) which does not interact with the hydroxamic or phosphonic acid binders.

Specifically, hydroxamic acids and phosphonic acids selectively bind to surfaces which are relatively basic, but they do not bind to surfaces which are more acidic. This can be thought of as an acid/base reaction. For instance, hafnium oxide ($HfO_2$) is relatively basic, so hydroxamic/phosphonic acid binds to it, and silicon dioxide is relatively acidic, so hydroxamic/phosphonic acid does not bind to it. Other examples of surfaces to which hydroxamic acids and phosphonic acids bind (selectively over binding to silicon dioxide) are silicon nitride and aluminum oxide.

It is believed that surfaces with an isoelectric point greater than the pKa of the acid (hydroxamic, phosphonic) used for the self-assembly will give better directed self-assembly in general, due to deprotonation of the acid. See, for example, Folkers. This is true for silicon nitride, aluminum oxide, hafnium oxide. Conversely, surfaces with an isoelectric point less than the pKa of the acid (hydroxamic, phosphonic) used for the self-assembly will give worse/no directed self-assembly. This is true for silicon dioxide. Thus, in general, according to the present techniques the nanowire surfaces for which coverage of the radiation-labile coating is desired can be formed from a material having an isoelectric point greater than the pKa of the acid (hydroxamic, phosphonic) used as the binder in the charged coating molecules.

A positively or negatively charged moiety of any kind can be easily tethered to the coating molecule. By way of example only, some specific examples of positively charged moieties include, but are not limited to, pyridinium, ammonium, or any other positively charged molecule. See FIG. 3C.

The term "nanowires" as used herein refers to rod-like structures, for example, having diameters of from about 10 nanometers (nm) to about 70 nm and lengths of from about 0.1 micrometers (µm) to about 100 µm. According to an exemplary embodiment, the nanowires are formed using a vapor liquid solid (VLS) growth process wherein the nanowires are grown using a metal (e.g., gold, indium and/or gallium) catalyst on a substrate. Volatile precursors used during the growth process dictate the composition of the nanowires (such as silane for Si nanowires and germane for Ge nanowires). Dopants (n-type or p-type) may be introduced during the growth process if so desired. The VLS process for nanowire formation is described, for example, in U.S. Pat. No. 7,998,788 issued to Guha et al., "Techniques for Use of Nanotechnology in Photovoltaics," the entire contents of which are incorporated by reference herein.

If desired, a shell layer can be formed around the nanowires. In that case, the nanowires grown as described above, would be considered a core nanowire structure (or simply a core) around which the shell layer (or simply the shell) is formed. As provided above, the core/shell configuration permits the semiconductor nanowires to be covered with a (shell) layer of a material which interacts with the binder in the coating molecules. According to an exemplary embodiment, the nanowire cores are silicon (Si) or germanium (Ge) and the shell is $HfO_2$ or $Al_2O_3$. As provided above, $HfO_2$ and $Al_2O_3$ selectively interact with binders such as hydroxamic and phosphonic acid.

When the nanowires, grown as described above, are still attached to the substrate, a shell can easily be formed around the nanowires using a conformal deposition process such as chemical vapor deposition. Following growth, and optional deposition of a shell layer, the nanowires can then be removed from the substrate. The nanowires prepared in this manner can be dispersed in a liquid medium, such as water, for used in a variety of applications.

Based on the concepts described above, an exemplary methodology for forming a nanowire-based radiation detector is described by way of reference to FIGS. 4-7. In this example, the radiation detection device will be configured as a transistor incorporating the nanowire(s) with the active, radiation-labile coating as the channel material. However, as provided above, this is only one exemplary device configuration into which the present nanowire radiation detectors may be incorporated. However, a transistor embodiment is useful since it provides an easy way for the transconductance of the nanowire detectors to be measured, see above.

Figure 4:
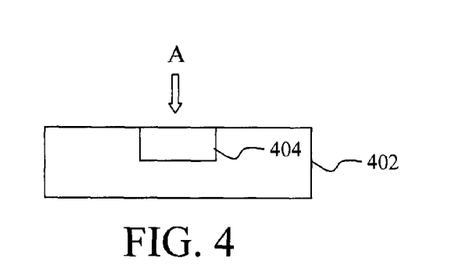
FIG. 4 is a cross-sectional diagram illustrating a starting platform for fabricating a nanowire-based radiation detector device that includes a semiconductor wafer having at least one back gate formed therein according to an embodiment of the present invention.

By way of non-limiting example only, as shown in FIG. 4 a wafer 402, e.g., a bulk semiconductor (e.g., Si, Ge, SiGe, etc.) wafer, is provided. At least one back gate 404 is formed in the wafer 402. As will be described in detail below, to increase sensitivity and/or reliability, a series of nanowire-based radiation detector devices can be prepared in accordance with the present techniques. Accordingly, a back gate 404 would be formed for each of the transistors being fabricated. The back gate can be formed using conventional lithography and etching techniques wherein a trench(es) is/are formed in the wafer and then filled with a conductive gate material, such as a metal(s) or doped polysilicon, to form the back gate(s) 404.

Figure 5:
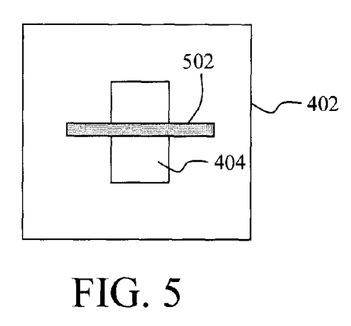
FIG. 5 is a top-down diagram illustrating at least one nanowire having been deposited onto the wafer over the back gate according to an embodiment of the present invention.

Next, as shown in FIG. 5, at least one nanowire 502 is deposited onto the wafer 402 over the back gate 404. FIG. 5 is a top-down view (for example from viewpoint A, see FIG. 4). While FIG. 5 depicts a single nanowire 502 having been deposited onto the wafer, multiple nanowires 502 can be deposited onto the wafer in the same manner as now described.

As provided in detail above, the nanowires can be prepared using a VLS process and then dispersed in a liquid medium, such as water. Further, as provided above, the nanowires can be formed having a core/shell configuration (e.g., a Si core and $HfO_2$ or $Al_2O_3$ shell). The nanowire dispersion can be spun onto wafer. A concentration of the nanowires in the liquid medium can be tailored to the density of the nanowires desired on the wafer. Alternatively, deposition of the nanowires onto the wafer through a patterned mask can ensure that a proper placement and number of nanowires are received on the wafer.

Further, as will be described in detail below, the charged coating can be formed on the nanowires later in the process (e.g., after source and drain formation). However, if so desired, the charged molecules can be contacted with (i.e., added directly) the dispersion of the as-prepared nanowires—prior to the nanowires being deposited onto the wafer.

Figure 6:
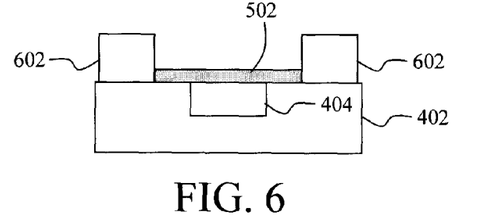
FIG. 6 is a cross-sectional diagram illustrating source and drain electrodes having been formed on the wafer in contact with opposite ends of the nanowire(s) according to an embodiment of the present invention.

Switching back to a cross-sectional view, as shown in FIG. 6, source and drain electrodes 602 are then formed in contact with opposite ends of the nanowire(s) 502. By way of example only, the source and drain electrodes 602 may be formed using a standard silicidation process.

If not already present (see above) the radiation-labile charged coating can now be formed on the nanowire(s). See FIG. 7. According to an exemplary embodiment, a solution containing the above-described radiation-labile charged molecules in a solvent (such as water) can be contacted with the wafer (e.g., the wafer can be soaked in the solution or the solution can be deposited onto the wafer). As described above, the nanowires can have a shell formed from a material that interacts with the binder in the charged molecules (such as $HfO_2$ or $Al_2O_3$ for a hydroxamic or phosphonic acid binder). In that case, the wafer can be simply contacted with the solution of radiation-labile, charged molecules. By way of the interaction between the molecules and the shell layer, the molecules will bind to the surface of the nanowire(s) 502. Excess molecules can then be removed using, e.g., water. The device is now considered complete. Optionally, the device can be peeled off and transferred onto a flexible (e.g., plastic) substrate (not shown).

As provided above, the presence of the charged moieties in the radiation-labile coating affects the transconductance of the nanowire(s). The transconductance of the nanowire(s) can be read via the source and drain electrodes. Specifically, the output signal from the device is an I/V curve, and depending on the charge on the surface of the nanowire, the turning point of the curve will occur at different voltage values. See, for example, FIG. 11, described below. The I/V curve can be obtained by scanning the voltage (V) and reading the current (I) obtained. Further, the amount of radiation to which the charged nanowire has been exposed to will be directly proportional to the amount of charged molecules still left on the surface of the nanowire, so the radiation dose can be derived from the electric properties of the nanowire transistor. However, for higher sensitivity and reliability, a series of nanowire transistors can be incorporated within the same device, so that the signal could be composed of several individual signals coming from the different transistors within the device.

Figure 7:
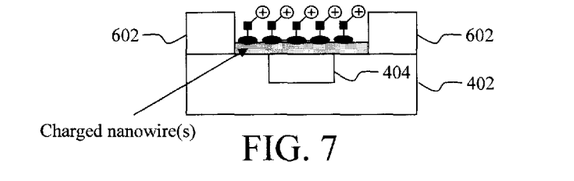
FIG. 7 is a cross-sectional diagram illustrating the nanowire(s) having been covered with a radiation-labile, charged coating according to an embodiment of the present invention.
Figure 8:
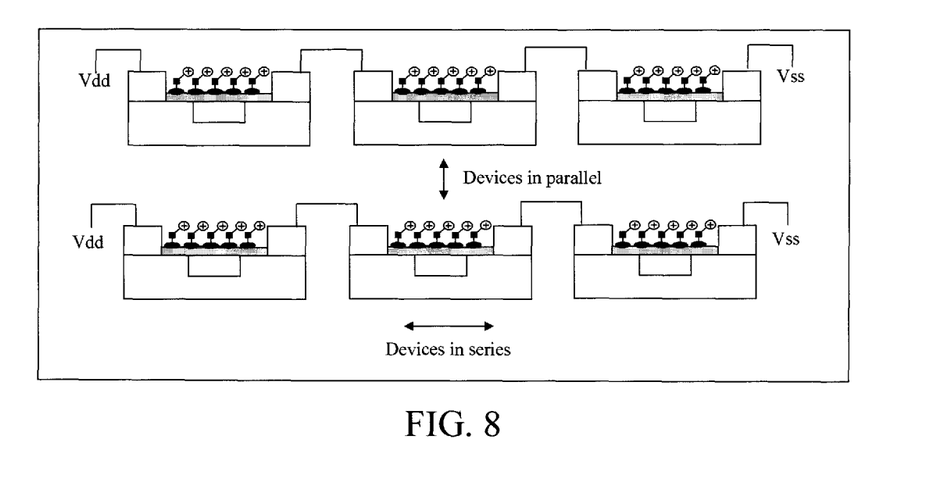
FIG. 8 is a diagram illustrating an exemplary configuration of the present radiation detection device employing multiple radiation-labile nanowire-based transistors in series and/or in parallel according to an embodiment of the present invention.

For example, FIG. 8 is a diagram illustrating a nanowire-based radiation detector having multiple transistor devices fabricated in the manner described in conjunction with the description of FIGS. 4-7, above. Namely, as shown in FIG. 8, the multiple devices can be employed in series and/or in parallel. The increased number of radiation-labile coated nanowires naturally increases the sensitivity of the device. Further, the output from each device (or series of devices) can be compared to ensure the readings obtained are accurate.

Figure 9:
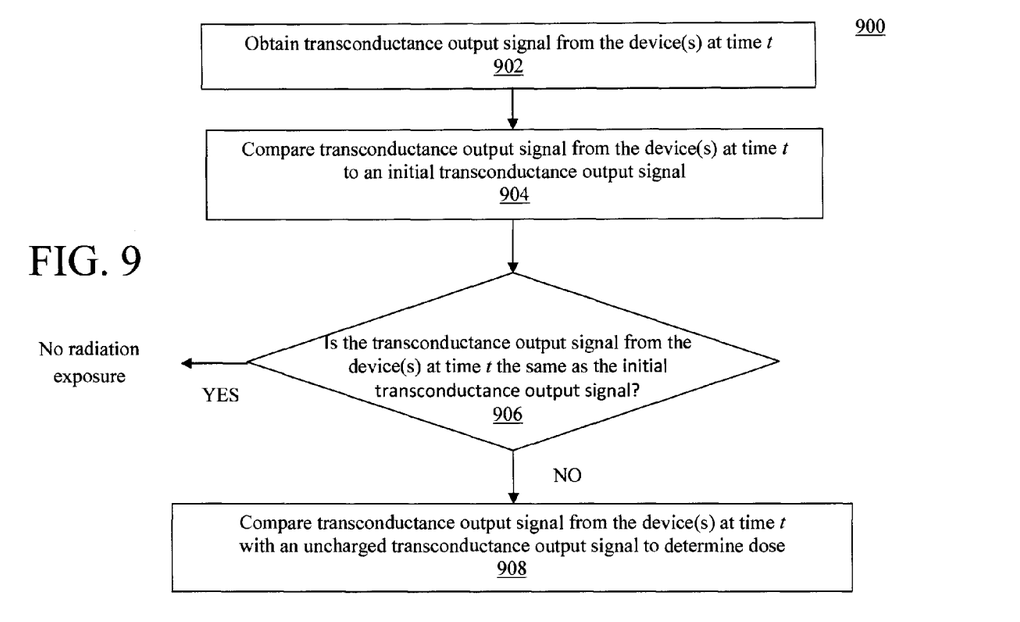
FIG. 9 is a diagram illustrating an exemplary methodology for radiation detection according to an embodiment of the present invention.

FIG. 9 is a diagram illustrating an exemplary methodology 900 for radiation detection according to the present techniques. In step 902, at time t, an output signal from one or more of the present nanowire-based radiation-labile detection devices is obtained. As provided above, the signal is measured as the transconductance of the nanowire(s) which changes depending on whether there are charged moieties present on the radiation-labile coating, and if so, how much.

In step 904, the transconductance output signal obtained from the device(s) at time t is compared to an initial transconductance output signal (i.e., a transconductance signal measured prior to any radiation exposure). A determination is made as per step 906 as to whether the transconductance output signal obtained from the device(s) at time t is the same as the initial transconductance output signal. If the transconductance output signal obtained from the device(s) at time t is the same as the initial transconductance output signal, then it is assumed that the device has not been exposed to radiation.

On the other hand, if the transconductance output signal obtained from the device(s) at time t is not the same as the initial transconductance output signal, then it is assumed that the device has been exposed to radiation. In that case, in step 908, the transconductance output signal obtained from the device(s) at time t is compared with an uncharged transconductance output signal which is the transconductance output signal obtained when none of the molecules in the coating retain their charged groups. The uncharged transconductance output signal of the device can be obtained using a control sample of the device prepared having a radiation-labile coating without any charged moieties and a second control device (initially provided with the charged moieties) and exposing the second control device to known doses of radiation until the transconductance output signal of both control devices are the same, indicating that neither have any charged moieties. By comparing the transconductance output signal obtained from the device(s) at time t with an uncharged transconductance output signal, the dose can thus be determined relative to a zero dose (no exposure) and maximum does (from the controls).

Figure 10:
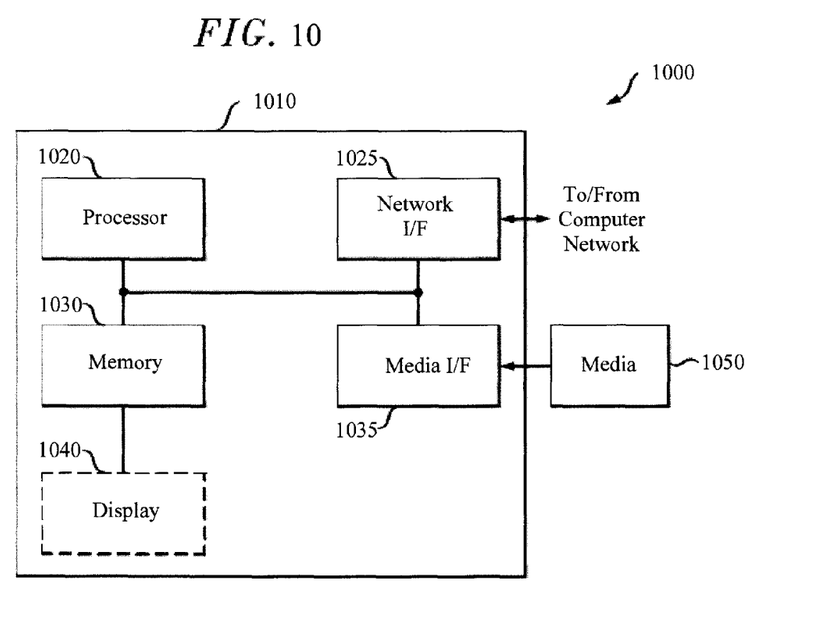
FIG. 10 is a diagram of an apparatus configured to perform one or more of the methodologies presented herein according to an embodiment of the present invention.

Methodology 900 may be performed by an apparatus, such as apparatus 1000 of FIG. 10. Namely, FIG. 10 is a block diagram of an apparatus 1000 for implementing one or more of the methodologies presented herein. By way of example only, apparatus 1000 can be configured to implement one or more of the steps of methodology 900 of FIG. 9 for radiation detection.

Apparatus 1000 comprises a computer system 1010 and removable media 1050. Computer system 1010 comprises a processor device 1020, a network interface 1025, a memory 1030, a media interface 1035 and an optional display 1040. Network interface 1025 allows computer system 1010 to connect to a network, while media interface 1035 allows computer system 1010 to interact with media, such as a hard drive or removable media 1050.

As is known in the art, the methods and apparatus discussed herein may be distributed as an article of manufacture that itself comprises a machine-readable medium containing one or more programs which when executed implement embodiments of the present invention. For instance, when apparatus 1000 is configured to implement one or more of the steps of methodology 900 the machine-readable medium may contain a program configured to obtain a transconductance output signal from a radiation detection device at time t, wherein the radiation detection device comprises at least one nanowire having a radiation-labile coating with charged moieties on a surface thereof, wherein the radiation-labile coating is configured to degrade upon exposure to radiation such that the charged moieties are cleaved from the radiation-labile coating upon exposure to radiation and thereby affect a transconductance of the nanowire; compare the transconductance output signal obtained from the radiation detection device at time t to an initial transconductance output signal of the radiation detection device; determine whether the transconductance output signal obtained from the radiation detection device at time t is the same as the initial transconductance output signal of the radiation detection device; and determine that the radiation detection device has not been exposed to radiation if the transconductance output signal obtained from the radiation detection device at time t is the same as the initial transconductance output signal of the radiation detection device, otherwise determining that the device has been exposed to radiation The machine-readable medium may be a recordable medium (e.g., floppy disks, hard drive, optical disks such as removable media 1050, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor device 1020 can be configured to implement the methods, steps, and functions disclosed herein. The memory 1030 could be distributed or local and the processor device 1020 could be distributed or singular. The memory 1030 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1020. With this definition, information on a network, accessible through network interface 1025, is still within memory 1030 because the processor device 1020 can retrieve the information from the network. It should be noted that each distributed processor that makes up processor device 1020 generally contains its own addressable memory space. It should also be noted that some or all of computer system 1010 can be incorporated into an application-specific or general-use integrated circuit.

Optional display 1040 is any type of display suitable for interacting with a human user of apparatus 1000. Generally, display 1040 is a computer monitor or other similar display.

Figure 11:
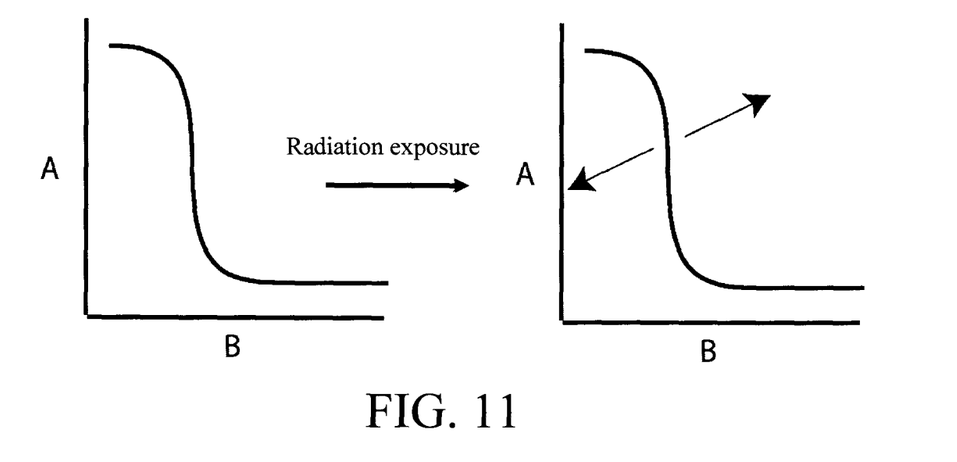
FIG. 11 is a diagram illustrating how an output signal of the present radiation detection devices will change due to a change in transconductance based on exposure to radiation according to an embodiment of the present invention.

As provided above, in the present radiation detection devices, the presence of the charged moieties in the radiation-labile coating affects the transconductance of the nanowire(s) which can be read via the source and drain electrodes (see, for example, FIG. 7). The output signal from the device is essentially an IN curve which shifts based on the transconductance of the nanowire(s). Thus, due to the change in transconductance upon exposure to radiation, the output signal of the device will change. See, for example, FIG. 11. Voltage can be plotted on the x-axes in FIG. 11 (labeled B), and current can be plotted on the y-axes (labeled A). As shown in FIG. 11, upon exposure to radiation the turning point of the I-V curve will change.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A radiation detection device, comprising:
   at least one nanowire having a radiation-labile coating on a surface thereof, wherein the radiation-labile coating comprises a monolayer of charged molecules having charged moieties tethered to the charged molecules and extending out from the surface of the nanowire, and wherein the radiation-labile coating is configured to degrade upon exposure to radiation such that the charged moieties are irreversibly cleaved from the radiation-labile coating upon exposure to radiation and thereby affect a transconductance of the nanowire.

2. The radiation detection device of claim 1, wherein each of the charged molecules has 1) a binder group configured to bind a molecule of the charged molecules to the nanowire, 2) a radiation-labile linker group, and 3) a charged moiety.

3. The radiation detection device of claim 2, wherein the nanowire comprises a semiconductor core covered with a shell layer comprising a material that selectively interacts with the binder group via an acid-base reaction such that the charged molecules are selectively bound only to the shell layer.

4. The radiation detection device of claim 3, wherein the binder group comprises a hydroxamic acid or a phosphonic acid.

5. The radiation detection device of claim 3, wherein the shell layer comprises hafnium oxide or aluminum oxide.

6. The radiation detection device of claim 2, wherein the charged moiety comprises a pyridinium or an ammonium charged moiety.

7. The radiation detection device of claim 2, wherein the radiation-labile linker group comprises an alkyl-sulfone.

8. A radiation detection device, comprising:
   at least one transistor comprising:
     a back gate formed in a wafer;
     at least one nanowire on the wafer over the back gate, the nanowire having a radiation-labile coating on a surface thereof, wherein the radiation-labile coating comprises a monolayer of charged molecules having charged moieties tethered to the charged molecules and extending out from the surface of the nanowire, and wherein the radiation-labile coating is configured to degrade upon exposure to radiation such that the charged moieties are irreversibly cleaved from the radiation-labile coating upon exposure to radiation and thereby affect a transconductance of the nanowire; and
     source and drain electrodes in contact with opposite ends of the nanowire.

9. The radiation detection device of claim 8, wherein each of the charged molecules has 1) a binder group configured to bind a molecule of the charged molecules to the nanowire, 2) a radiation-labile linker group, and 3) a charged moiety.

10. The radiation detection device of claim 9, wherein the charged moiety comprises a pyridinium or an ammonium charged moiety.

11. The radiation detection device of claim 9, wherein the radiation-labile linker group comprises an alkyl-sulfone.

12. A method of forming a radiation detection device, the method comprising the steps of:
   forming a back gate in a wafer;
   depositing at least one nanowire on the wafer over the back gate;
   forming source and drain electrodes in contact with opposite ends of the nanowire; and
   covering a surface of the nanowire with a radiation-labile coating having charged moieties, wherein the radiation-labile coating comprises a monolayer of charged molecules having charged moieties tethered to the charged molecules and extending out from the surface of the nanowire, and wherein the radiation-labile coating is configured to degrade upon exposure to radiation such that the charged moieties are irreversibly cleaved from the radiation-labile coating upon exposure to radiation and thereby affect a transconductance of the nanowire.

13. The method of claim 12, wherein each of the charged molecules has 1) a binder group configured to bind a molecule of the charged molecules to the nanowire, 2) a radiation-labile linker group, and 3) a charged moiety, wherein the nanowire comprises a semiconductor core covered with a shell layer comprising a material that selectively interacts with the binder group via an acid-base reaction, and wherein the step of covering the surface of the nanowire with the radiation-labile coating comprises the step of:

contacting the nanowire with a solution containing the charged molecules to enable interaction of the binder group of the molecules with the shell layer such that the molecules are selectively bound only to the shell layer and form the radiation-labile coating covering the surface of the nanowire.

14. The method of claim 13, wherein the binder group comprises a hydroxamic acid or a phosphonic acid.

15. The method of claim 13, wherein the shell layer comprises hafnium oxide or aluminum oxide.

16. A method for radiation detection, the method comprising the steps of:

obtaining a transconductance output signal from a radiation detection device at time t, wherein the radiation detection device comprises at least one nanowire having a radiation-labile coating on a surface thereof, wherein the radiation-labile coating comprises a monolayer of charged molecules having charged moieties tethered to the charged molecules and extending out from the surface of the nanowire, and wherein the radiation-labile coating is configured to degrade upon exposure to radiation such that the charged moieties are irreversibly cleaved from the radiation-labile coating upon exposure to radiation and thereby affect a transconductance of the nanowire;

comparing the transconductance output signal obtained from the radiation detection device at time t to an initial transconductance output signal of the radiation detection device;

determining whether the transconductance output signal obtained from the radiation detection device at time t is the same as the initial transconductance output signal of the radiation detection device; and determining that the radiation detection device has not been exposed to radiation if the transconductance output signal obtained from the radiation detection device at time t is the same as the initial transconductance output signal of the radiation detection device, otherwise determining that the device has been exposed to radiation.

17. The method of claim 16, further comprising the step of:

comparing the transconductance output signal obtained from the radiation detection device at time t with an uncharged transconductance output signal from the radiation detection device, which is the transconductance output signal obtained when none of the molecules in the coating retain their charged groups, to determine a dose of the radiation to which the radiation detection device has been exposed.

18. The method of claim 16, wherein each of the charged molecules has 1) a binder group configured to bind a molecule of the charged molecules to the nanowire, 2) a radiation-labile linker group, and 3) a charged moiety.

19. The method of claim 18, wherein the charged moiety comprises a pyridinium or an ammonium charged moiety.

20. The method of claim 18, wherein the radiation-labile linker group comprises an alkyl-sulfone.

* * * * *